US010964869B2

(12) United States Patent
Lee et al.

(10) Patent No.: US 10,964,869 B2
(45) Date of Patent: Mar. 30, 2021

(54) TRANSPARENT LIGHT EMITTING ELEMENT DISPLAY

(71) Applicant: LG CHEM, LTD., Seoul (KR)

(72) Inventors: Kun Seok Lee, Daejeon (KR); Yong Goo Son, Daejeon (KR); Seung Heon Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 16/625,299

(22) PCT Filed: Jul. 25, 2018

(86) PCT No.: PCT/KR2018/008407
§ 371 (c)(1),
(2) Date: Dec. 20, 2019

(87) PCT Pub. No.: WO2019/022500
PCT Pub. Date: Jan. 31, 2019

(65) Prior Publication Data
US 2020/0251637 A1 Aug. 6, 2020

(30) Foreign Application Priority Data
Jul. 28, 2017 (KR) .................. 10-2017-0096101

(51) Int. Cl.
*H01L 33/62* (2010.01)
*H01L 25/075* (2006.01)

(52) U.S. Cl.
CPC .......... *H01L 33/62* (2013.01); *H01L 25/0753* (2013.01)

(58) Field of Classification Search
CPC ... H01L 33/62; H01L 25/0753; H01L 27/156; H01L 33/36
See application file for complete search history.

(56) References Cited

U.S. PATENT DOCUMENTS

| 5,767,818 A | 6/1998 | Nishida |
| 6,097,351 A | 8/2000 | Nishida |
| (Continued) | | |

FOREIGN PATENT DOCUMENTS

| EP | 3128565 A1 | 2/2017 |
| JP | 2934662 | 8/1999 |
| (Continued) | | |

OTHER PUBLICATIONS

Extended Search Report of European Patent Office in Appl'n No. 18837540.6, dated Jul. 9, 2020.
(Continued)

*Primary Examiner* — Victor A Mandala
(74) *Attorney, Agent, or Firm* — Dentons US LLP

(57) ABSTRACT

A transparent light emitting element display, comprising: a transparent substrate; at least one light emitting element which is provided on the transparent substrate; and a first common electrode wiring portion, a second common electrode wiring portion, and a signal electrode wiring portion which are provided on the transparent substrate, in which all of the first common electrode wiring portion, the second common electrode wiring portion, and the signal electrode wiring portion comprise metal mesh patterns, respectively, each of the metal mesh patterns, which constitute the first common electrode wiring portion, the second common electrode wiring portion, and the signal electrode wiring portion, has a standard deviation of a line width which is 20% or less, a standard deviation of a pitch which is 10% or less, and a standard deviation of a line height which is 10% or less, and the metal mesh patterns are provided in a region having an area of 80% or more of an overall area on the transparent substrate.

13 Claims, 4 Drawing Sheets

(56) References Cited

U.S. PATENT DOCUMENTS

| | | | |
|---|---|---|---|
| 2010/0156840 A1* | 6/2010 | Frey | C23F 1/14 345/174 |
| 2012/0187821 A1* | 7/2012 | Lee | G06F 3/041 313/498 |
| 2014/0043280 A1* | 2/2014 | Cok | G06F 3/0443 345/174 |
| 2014/0253493 A1 | 9/2014 | Cho | |
| 2015/0077368 A1 | 3/2015 | Chen et al. | |
| 2015/0271930 A1* | 9/2015 | Cok | H05K 3/4638 156/60 |
| 2015/0378481 A1* | 12/2015 | Cok | G06F 3/0443 345/173 |
| 2016/0139707 A1 | 5/2016 | Nakamura et al. | |
| 2016/0227407 A1 | 8/2016 | Meng et al. | |
| 2016/0245491 A1 | 8/2016 | Kim | |
| 2016/0313827 A1* | 10/2016 | Song | G06F 3/0412 |
| 2017/0005247 A1 | 1/2017 | Maki | |
| 2017/0156206 A1* | 6/2017 | Kogawa | G06F 3/0446 |
| 2017/0229531 A1 | 8/2017 | Shi et al. | |
| 2017/0308192 A1* | 10/2017 | Ogura | H05K 1/11 |
| 2017/0355173 A1* | 12/2017 | Tanaka | C09J 145/02 |
| 2018/0049318 A1 | 2/2018 | Maki | |
| 2018/0301437 A1 | 10/2018 | Maki | |
| 2018/0321763 A1* | 11/2018 | Liu | G06F 3/047 |

FOREIGN PATENT DOCUMENTS

| | | |
|---|---|---|
| JP | 2006344163 | 12/2006 |
| JP | 2010191504 | 9/2010 |
| JP | 2016095675 | 5/2016 |
| KR | 10-1105887 | 1/2012 |
| KR | 20140110273 | 9/2014 |
| KR | 20160094162 | 8/2016 |
| KR | 10-2016-0103918 | 9/2016 |
| KR | 20160103818 | 9/2016 |
| KR | 101689131 | 12/2016 |
| WO | 2016019699 | 2/2016 |
| WO | 2016178322 | 11/2016 |
| WO | 2017-042252 | 3/2017 |
| WO | 2017-115712 | 7/2017 |

OTHER PUBLICATIONS

International Search Report and the Written Opinion of PCT/KR2018/008407, dated Oct. 31, 2018.

Office Action of Korean Patent Office in Appl'n No. 10-2018-0086621 dated Apr. 1, 2020.

* cited by examiner

[Figure 1]
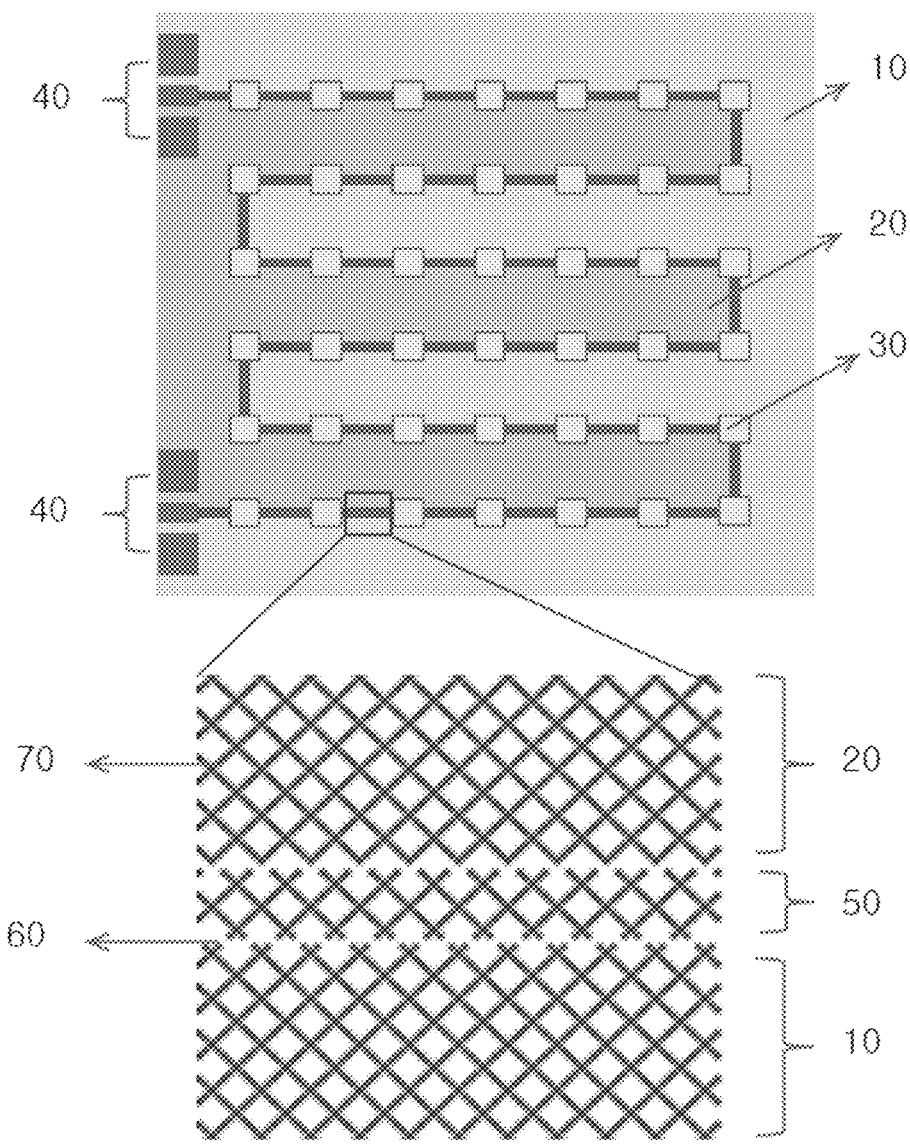

[Figure 2]
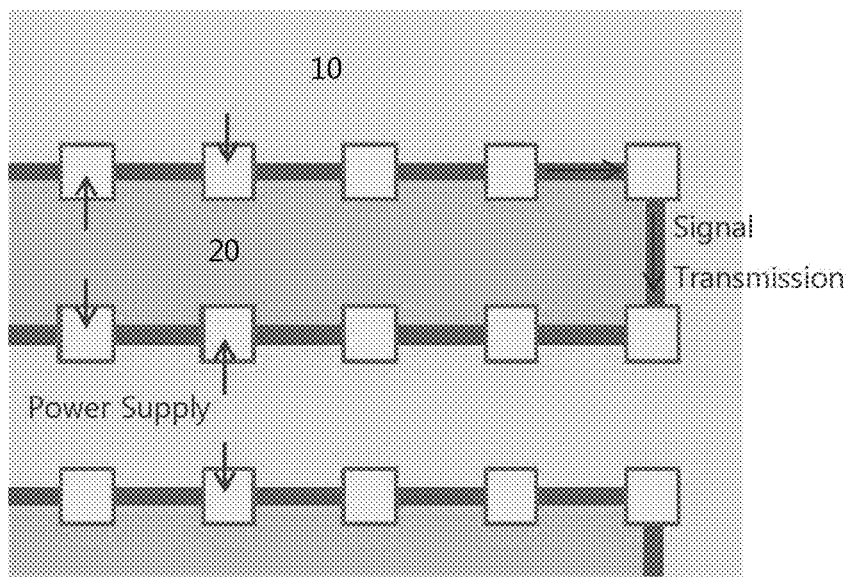
[Figure 3]
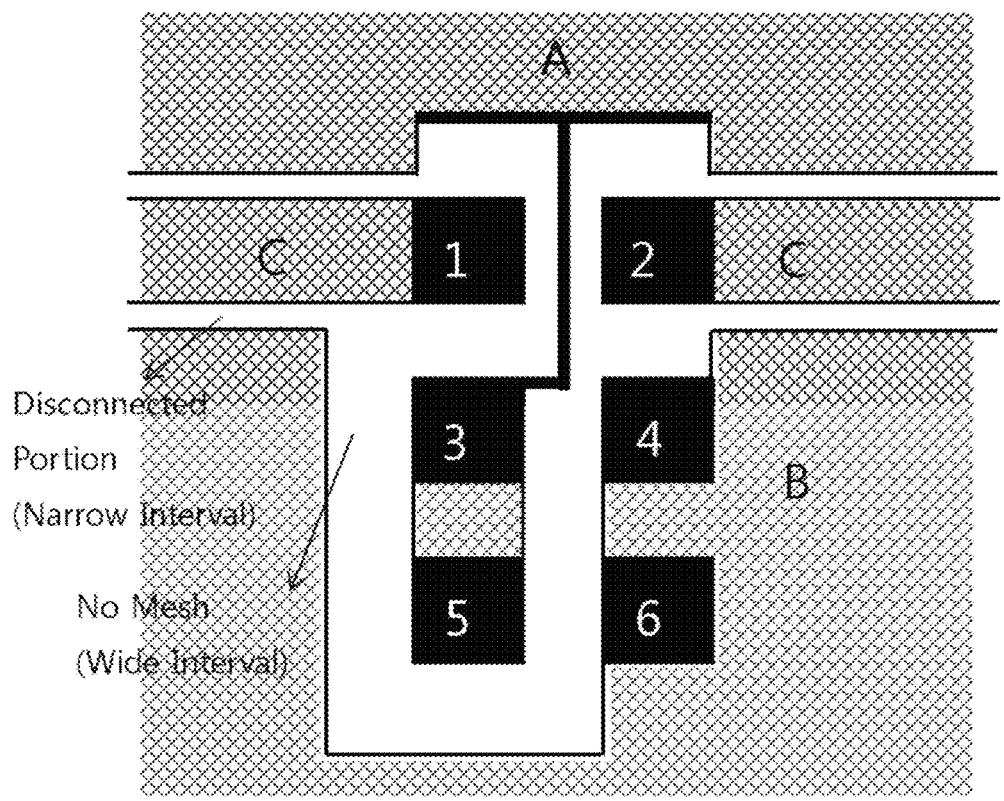

[Figure 4]
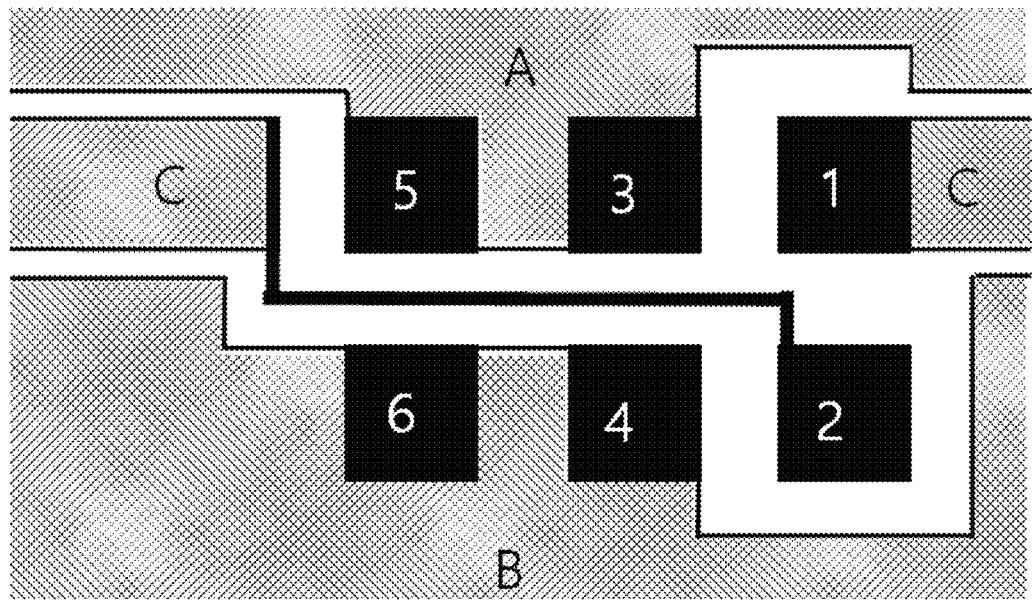
[Figure 5]
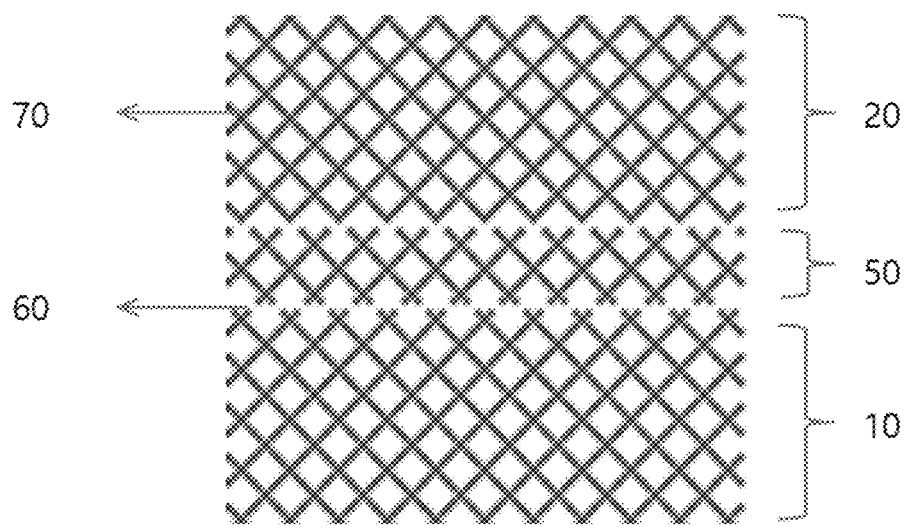

[Figures 6A and 6B   <<PRIOR ART>>  ]
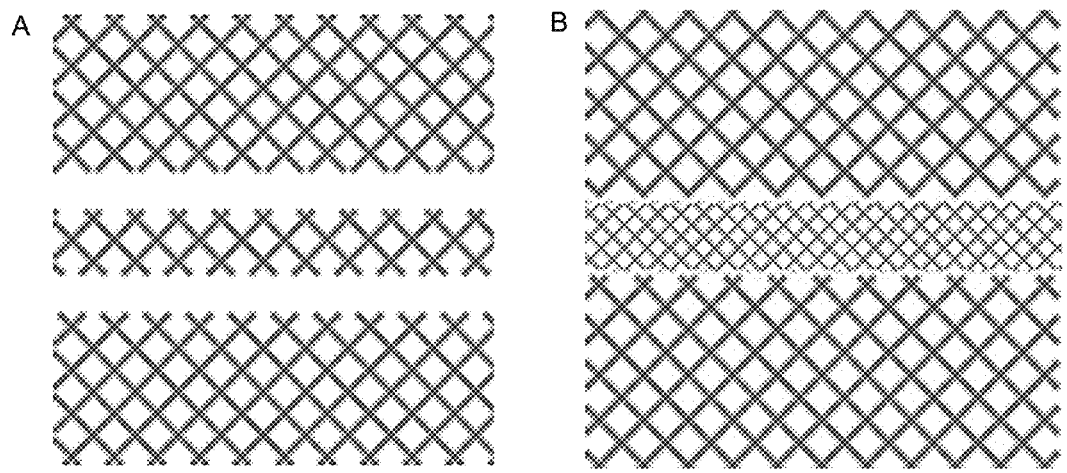
[Figure 7]
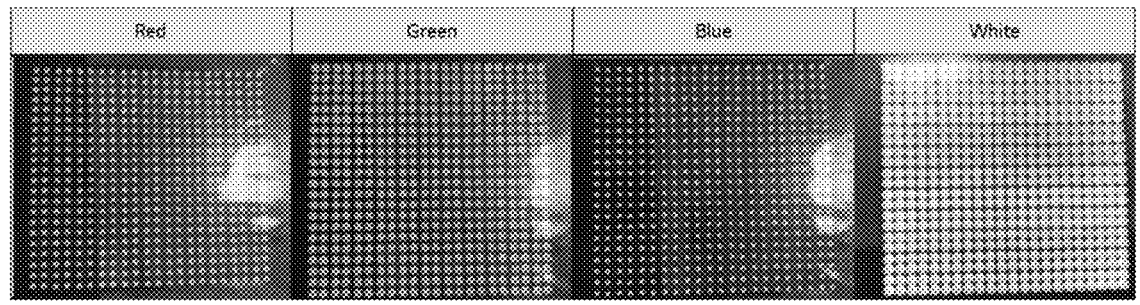
[Figure 8]
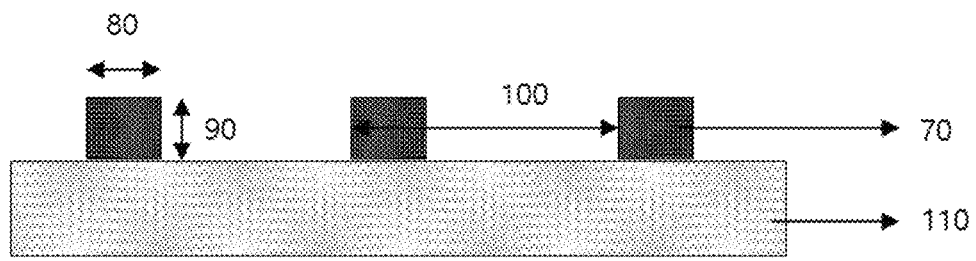

TRANSPARENT LIGHT EMITTING ELEMENT DISPLAY

CROSS-REFERENCE TO RELATED APPLICATIONS

This application is a National Stage Application of International Application No. PCT/KR2018/008407, filed on Jul. 25, 2018, which claims priority to and the benefit of Korean Patent Application No. 10-2017-0096101 filed in the Korean Intellectual Property Office on Jul. 28, 2017, the entire contents of which are incorporated herein by reference.

TECHNICAL FIELD

The present application relates to a transparent light emitting element display.

BACKGROUND

Recently in Korea, various types of scenery lighting as well as gorgeous signboards are created in parks and downtowns through fusion of cutting-edge ICT technologies and cutting-edge LED technologies, thereby providing urban residents with information and spectacles. In particular, a transparent LED display made of a transparent electrode material is configured by applying the LED between glass and glass and has an advantage in that luxurious appearances can be created because no electric wire is visible. For this reason, the transparent LED display is utilized for interior decoration in hotels, department stores, and the like and increases in importance in implementing media facades of outer walls of buildings.

Demands for transparent electrodes, which are transparent, allow electricity to flow therethrough, and thus are used for touch screens or the like, are exponentially increased as smart devices come into wide use, and the most widely used transparent electrode, among the transparent electrodes, is indium tin oxide (ITO) which is oxide of indium and tin. However, the indium, which is a main ingredient of the ITO transparent electrode material, is produced only in some countries such as China, there is a small amount of indium reserves globally, and a large amount of costs are required to produce the indium. In addition, the indium has a high and inconsistent resistance value and thus has a disadvantage in that emitted LED light cannot exhibit desired and constant brightness. For this reason, there is a limitation in that the transparent LED utilizing the ITO cannot be utilized as a high-performance and low-priced transparent electrode material.

The ITO, in fact, has been used as the transparent electrode material with the largest market share, but due to a limitation in terms of economic feasibility, restrictive performance, and the like, researches and technology development, which utilize new materials, are being consistently conducted. There are metal meshes, nanowires (Ag nanowires), carbon nanotubes (CNTs), conductive polymers, graphene, and the like as transparent electrode materials that attract the attention as next-generation materials. Among the materials, the metal mesh is a new material that occupies 85% of the materials substituted for the ITO, and the metal mesh is low in price and has high conductivity, such that the market related to the metal mesh expands in view of utilization.

A transparent LED display, which utilizes the metal mesh, has much better conductivity than a transparent display in the related art, makes it easy to perform maintenance, saves resources, greatly reduces environmental pollution, and has economic feasibility resulting from a reduction in manufacturing costs. In addition, the metal mesh can be widely applied for various purposes and can likely be applied and utilized as a new transparent electrode material for various products.

Technical Problem

The present application has been made an effort to provide a transparent light emitting element display using a metal mesh pattern.

Technical Solution

An exemplary embodiment of the present application provides a transparent light emitting element display comprising: a transparent substrate; at least one light emitting element which is provided on the transparent substrate; and a first common electrode wiring portion, a second common electrode wiring portion, and a signal electrode wiring portion which are provided on the transparent substrate, in which all of the first common electrode wiring portion, the second common electrode wiring portion, and the signal electrode wiring portion comprise metal mesh patterns, respectively, each of the metal mesh patterns, which constitute the first common electrode wiring portion, the second common electrode wiring portion, and the signal electrode wiring portion, has a standard deviation of a line width which is 20% or less, a standard deviation of a pitch which is 10% or less, and a standard deviation of a line height which is 10% or less, and the metal mesh patterns are provided in a region having an area of 80% or more of an overall area on the transparent substrate.

Advantageous Effects

According to the exemplary embodiment of the present application, the metal mesh patterns, which have the same line width, the same line height, and the same pitch, are applied to the first common electrode wiring portion, the second common electrode wiring portion, and the signal electrode wiring portion, and as a result, it is possible to reduce wiring recognition. In addition, since the metal mesh patterns are provided within the entire region of the effective screen portion on the transparent substrate except for the region in which the light emitting element is provided, it is possible to reduce resistance by maximizing the areas of the common electrode wiring portions.

In addition, according to the exemplary embodiment of the present application, it is possible to reduce wiring recognition by minimizing the widths of the disconnected portions that separate the metal mesh patterns of the first common electrode wiring portion, the second common electrode wiring portion, and the signal electrode wiring portion.

DESCRIPTION OF DRAWINGS

FIG. 1 is a view schematically illustrating electrode wiring of a transparent light emitting element display according to an exemplary embodiment of the present application.

FIG. 2 is a view schematically illustrating signal transmission between electrodes and a flow of a power supply in the transparent light emitting element display according to the exemplary embodiment of the present application.

FIGS. 3 and 4 are views each schematically illustrating an electrode pad portion of the transparent light emitting element display according to the exemplary embodiment of the present application.

FIG. 5 is a view schematically illustrating a metal mesh pattern according to the exemplary embodiment of the present application.

FIGS. 6A and 6B are views schematically illustrating metal mesh patterns in the related art.

FIG. 7 is a view schematically illustrating an image operated by the transparent light emitting element display according to the exemplary embodiment of the present application.

FIG. 8 is a view schematically illustrating a line width, a line height, and a pitch of the metal mesh pattern according to the exemplary embodiment of the present application.

EXPLANATION OF REFERENCE NUMERALS AND SYMBOLS

10: First common electrode wiring portion
20: Second common electrode wiring portion
30: Light emitting element
40: Power supply unit
50: Signal electrode wiring portion
60: Disconnected portion
70: Metal mesh pattern
80: Line width of metal mesh pattern
90: Line height of metal mesh pattern
100: Pitch of metal mesh pattern
110: Transparent substrate

BEST MODE

Hereinafter, the present application will be described in detail.

A transparent LED display provides urban residents with various spectacles by providing information service and creating sceneries, and demands for the transparent LED display are increased in various fields. The ITO, in fact, has been used up to now as the transparent electrode material with the largest market share, but due to a limitation in terms of economic feasibility, restrictive performance, and the like, researches and technology development, which utilize new materials, are being consistently conducted.

More specifically, transparent electrode wiring was formed by using Ag nanowires or transparent metal oxide (ITO, IZO, etc.) in order to implement a transparent LED display in the related art. However, because the Ag nanowire or the transparent metal oxide (ITO, IZO, etc.) has high resistance, the number of operating LEDs is restricted, and as a result, there is a limitation in increasing an area of the transparent LED display. In addition, in a case in which a thickness of the Ag nanowire or the transparent metal oxide is increased to reduce the resistance, there occurs a problem that transmittance of the transparent LED display deteriorates.

Therefore, the present application is characterized by applying a metal mesh pattern to transparent electrode wiring of a transparent light emitting element display in order to provide the transparent light emitting element display having excellent resistance properties and visibility.

A transparent light emitting element display according to an exemplary embodiment of the present application comprises: a transparent substrate; at least one light emitting element which is provided on the transparent substrate; and a first common electrode wiring portion, a second common electrode wiring portion, and a signal electrode wiring portion which are provided on the transparent substrate, in which all of the first common electrode wiring portion, the second common electrode wiring portion, and the signal electrode wiring portion comprise metal mesh patterns, respectively, each of the metal mesh patterns, which constitute the first common electrode wiring portion, the second common electrode wiring portion, and the signal electrode wiring portion, has a standard deviation of a line width which is 20% or less, a standard deviation of a pitch which is 10% or less, and a standard deviation of a line height which is 10% or less, and the metal mesh patterns are provided in a region having an area of 80% or more of an overall area on the transparent substrate.

In the exemplary embodiment of the present application, at least four electrode pad portions, which electrically connect the light emitting element with the first common electrode wiring portion, the second common electrode wiring portion, and the signal electrode wiring portion, can be provided between the transparent substrate and the light emitting element. In this case, as illustrated in FIGS. 3 and 4 to be described below, no metal mesh pattern can be provided within at least a part of a region between the at least four electrode pad portions.

In the exemplary embodiment of the present application, two or more light emitting elements can be provided on the transparent substrate, and the two or more light emitting elements can be connected in series to the signal electrode wiring portion. The number of light emitting elements is not particularly limited and can be appropriately selected by those skilled in the art in consideration of the purpose or the like of the transparent light emitting element display. More specifically, the number of light emitting elements is related to resistance of an electrode, and the number of light emitting elements can be increased if the electrode has sufficiently low resistance and the display has a large area. Resolution is increased if the number of light emitting elements is increased in a state in which the area remains the same, and the area of the display is increased if the number of light emitting elements is increased in a state in which the interval remains the same, such that an electric wire line of an electric power supply unit can be reduced, and as a result, the number of light emitting elements can be appropriately selected by those skilled in the art in consideration of the purpose or the like of the transparent light emitting element display.

In the exemplary embodiment of the present application, the two or more light emitting elements can be connected in series to the signal electrode wiring portion and connected in series to the first common electrode wiring portion and the second common electrode wiring portion. The first common electrode wiring portion and the second common electrode wiring portion provide the amount of electric current sufficient to operate the light emitting element, and the light emitting element can be connected in series to the signal electrode wiring portion because it is possible to send a signal with only a low electric current when sending a color signal of the light emitting element. If the respective electrodes are connected in parallel to the power supply unit to operate all of the light emitting elements and send a signal unlike the structure in the present application, all of the respective electrode widths need to be different from one another to adjust a resistance value in accordance with an arrangement distance between the light emitting elements (the electrode connected to the farthest light emitting element has the largest width), and it is difficult to implement a low-resistance electrode due to a spatial restriction to an electrode arrangement region because the multiple light emitting elements are provided.

In the exemplary embodiment of the present application, the signal electrode wiring portion can be provided between the first common electrode wiring portion and the second common electrode wiring portion.

In the exemplary embodiment of the present application, the first common electrode wiring portion can be a (+) common electrode wiring portion, and the second common electrode wiring portion can be a (−) common electrode wiring portion. In addition, the first common electrode wiring portion can be a (−) common electrode wiring portion, and the second common electrode wiring portion can be a (+) common electrode wiring portion.

The electrode wiring of the transparent light emitting element display according to the exemplary embodiment of the present application is schematically illustrated in FIG. 1.

According to the exemplary embodiment of the present application, a channel is formed to have a structure in which the signal electrode wiring portion passes between the (+) common electrode wiring portion and the (−) common electrode wiring portion, such that the electrode wiring is not extended for each light emitting element and can be connected, as a common electrode, to the (+) common electrode wiring portion and the (−) common electrode wiring portion. Signal transmission between electrodes and a flow of a power supply in the transparent light emitting element display according to the exemplary embodiment of the present application is schematically illustrated in FIG. 2.

In the exemplary embodiment of the present application, at least four electrode pad portions, which electrically connect the light emitting element with the first common electrode wiring portion, the second common electrode wiring portion, and the signal electrode wiring portion, can be provided between the transparent substrate and the light emitting element. According to the exemplary embodiment of the present application, four electrode pad portions, which connect the light emitting element with the first common electrode wiring portion, the second common electrode wiring portion, and the signal electrode wiring portion, can be provided between the transparent substrate and the light emitting element.

In the exemplary embodiment of the present application, the four electrode pad portions can comprise two signal electrode pad portions, one first common electrode pad portion, and one second common electrode pad portion. The two signal electrode pad portions are signal in-out pad portions for a light emitting element and can be provided at ends of the signal electrode wiring portions, respectively, and the first common electrode pad portion and the second common electrode pad portion can be provided at an end of the first common electrode wiring portion and an end of the second common electrode wiring portion, respectively. The ends mean regions in which the light emitting element is provided at an upper side thereof and the first common electrode wiring portion, the second common electrode wiring portion, and the signal electrode wiring portion are electrically connected to the light emitting element.

In addition, at least one capacitor pad portion can be additionally comprised on the transparent substrate. In the exemplary embodiment of the present application, the number of capacitor pad portions can be two.

The capacitor pad portion is a pad to which a capacitor is attached, and the capacitor can serve to stabilize an electric current to be supplied to the light emitting element.

FIGS. 3 and 4 are views each schematically illustrating an electrode pad portion of the transparent light emitting element display according to the exemplary embodiment of the present application. FIGS. 3 and 4 are views illustrating a case in which four electrode pad portions and two capacitor pad portions are provided.

More specifically, in FIGS. 3 and 4, part A illustrates a (+) common electrode wiring portion, part B illustrates a (−) common electrode wiring portion, and part C illustrates a signal electrode wiring portion. In addition, in FIGS. 3 and 4, electrode pad portions 1 and 2 are signal in-out pad portions for a light emitting element, that is, electrode pad portions provided to be connected to ends of the signal electrode wiring portion, an electrode pad portion 3 is a (+) pad portion of the light emitting element, that is, an electrode pad portion provided to be connected to an end of the (+) common electrode wiring portion, and an electrode pad portion 4 is a (−) pad portion of the light emitting element, that is, an electrode pad portion provided to be connected to an end of the (−) common electrode wiring portion. In addition, a capacitor pad portion 5 is a capacitor (+) pad portion, and a capacitor pad portion 6 is a capacitor (−) pad portion.

Parts A, B, and C comprise metal mesh patterns, and no metal mesh pattern is provided between the electrode pad portions 1 to 4. In addition, the electrode pad portions 1 to 4 and the capacitor pad portions 5 and 6 comprise no metal mesh pattern, and the entire region of each of the pad portions can be made of metal. More specifically, since the electrode pad portions and the capacitor pad portions are portions to be covered by the welded light emitting element, the electrode pad portions and the capacitor pad portions comprise no metal mesh pattern, and the entire region of each of the pad portions can be made of metal.

Intervals between the electrode pad portions and the capacitor pad portions can be each independently from 0.1 mm to 1 mm. With the aforementioned intervals, it is possible to prevent a short-circuit in consideration of a tolerance when performing screen printing with solder paste for forming the light emitting element later.

The shape of each of the electrode pad portions and the capacitor pad portions is not particularly limited and can be a quadrangular shape. In addition, a size of each of the electrode pad portions and the capacitor pad portions can be, but not limited only to, from 0.1 mm$^2$ to 1 mm$^2$.

The four electrode pad portions can be joined to one light emitting element. That is, in the exemplary embodiment of the present application, in a case in which multiple light emitting elements are provided on a transparent substrate, the respective light emitting elements can be joined to the four electrode pad portions.

In the exemplary embodiment of the present application, the first common electrode wiring portion, the second common electrode wiring portion, and the signal electrode wiring portion can comprise metal mesh patterns, respectively, which have the same line width, the same line height, and the same pitch. In the present application, the configuration in which the metal mesh patterns have the same line width means that a standard deviation of the line width is 20% or less, particularly, 10% or less, and more particularly, 5% or less. In addition, in the present application, the configuration in which the metal mesh patterns have the same line height means that a standard deviation of the line height is 10% or less, particularly, 5% or less, and more particularly, 2% or less. In addition, in the present application, the configuration in which the metal mesh patterns have the same pitch means that a standard deviation of the pitch is 10% or less, particularly, 5% or less, and more particularly, 2% or less.

In the exemplary embodiment of the present application, the metal mesh patterns can be provided within the entire region of an effective screen portion on the transparent substrate except for the region in which the light emitting element is provided. More specifically, the metal mesh patterns can be provided within a region having an area of 80% or more and 99.5% or less of an overall area on the transparent substrate. In addition, based on the overall area on the transparent substrate, the metal mesh patterns can be provided within a region having an area of 80% or more and 99.5% or less of an area of a region except for a flexible printed circuit board (FPCB) pad portion region and a light emitting element pad portion region provided on the transparent substrate. In the present application, the FPCB pad portion region can comprise an FPCB pad portion for applying external power, and an area of the FPCB pad portion region can be equal to or larger than an overall area of the FPCB pad portion and equal to or smaller than 3 times the overall area of the FPCB pad portion. In addition, in the present application, the light emitting element pad portion region comprises the electrode pad portions, and an area of the light emitting element pad portion region can be equal to or larger than 1.5 times the overall area of the electrode pad portions and equal to or smaller than 3 times the overall area of the electrode pad portions.

In the exemplary embodiment of the present application, the metal mesh pattern can satisfy the following Expression 1.

$$(P-W)^2/P^2 = 0.8 \quad \text{[Expression 1]}$$

In Expression 1, P is the pitch of the metal mesh pattern, and W is the line width of the metal mesh pattern.

In the exemplary embodiment of the present application, pattern shapes in the technical field can be used as the metal mesh patterns of the first common electrode wiring portion, the second common electrode wiring portion, and the signal electrode wiring portion. More specifically, the metal mesh pattern can comprise a polygonal pattern having one or more shapes of a triangle, a quadrilateral, a pentagon, a hexagon, and an octagon.

The metal mesh pattern can comprise a straight line, a curve, or a closed curve formed of a straight line or a curve.

Since the metal mesh patterns can be provided within the entire region of the effective screen portion of the upper surface of the transparent substrate except for the region in which the light emitting element is provided, it is possible to obtain a maximally acceptable wiring region, and thus it is possible to improve resistance properties of the transparent light emitting element display. More specifically, surface resistance of the metal mesh pattern can be 0.1 Ω/sq or less.

The pitch of the metal mesh pattern can be from 100 μm to 1,000 μm, from 100 μm to 600 μm, or from 100 μm to 300 μm, but the pitch of the metal mesh pattern can be adjusted by those skilled in the art in accordance with desired transmittance and conductivity. A material of the metal mesh pattern is not particularly limited, but can comprise one or more types of metal and metal alloys. The metal mesh pattern can comprise, but not limited only to, gold, silver, aluminum, copper, neodymium, molybdenum, nickel, or an alloy thereof.

The line height of the metal mesh pattern is not particularly limited, but can be 3 μm or more and 20 μm or less or 10 μm or less in terms of conductivity of the metal mesh pattern and economic feasibility of a forming process. More specifically, the line height of the metal mesh pattern can be from 3 μm to 20 μm, or from 3 μm to 10 μm.

The line width of the metal mesh pattern can be, but not limited only to, from 50 μm or less, from 25 μm or less, or from 20 μm or less. The smaller line width of the metal mesh pattern can be advantageous in terms of transmittance and wiring recognition but can cause a reduction in resistance, and in this case, the reduction in resistance can be improved by increasing the line height of the metal mesh pattern. The line width of the metal mesh pattern can be 5 μm or more.

An aperture ratio of the metal mesh pattern, that is, a ratio of an area, which is not covered by the pattern, can be 70% or more, 85% or more, or 95% or more.

According to the exemplary embodiment of the present application, the metal mesh patterns, which have the same line width, the same line height, and the same pitch, are applied to the first common electrode wiring portion, the second common electrode wiring portion, and the signal electrode wiring portion, and as a result, it is possible to reduce wiring recognition. If the metal mesh patterns of the first common electrode wiring portion, the second common electrode wiring portion, and the signal electrode wiring portion do not have the same line width, the same pitch, or the same line height, recognition of the wiring portions can be increased, which is not preferable.

In the exemplary embodiment of the present application, the metal mesh patterns of the first common electrode wiring portion, the second common electrode wiring portion, and the signal electrode wiring portion can be separated from one another by disconnected portions where no metal mesh pattern is provided. The disconnected portion means a region in which a part of the metal mesh pattern is disconnected and electrical connection is disconnected. A width of the disconnected portion can mean a distance between nearest ends of the first common electrode wiring portion, the second common electrode wiring portion, and the signal electrode wiring portion which are spaced apart from one another. A width of the disconnected portion can be, but not limited only to, 80 μm or less, 60 μm or less, 40 μm or less, or 30 μm or less. The width of the disconnected portion can be 5 μm or more.

The metal mesh pattern according to the exemplary embodiment of the present application is schematically illustrated in FIG. 5, and a metal mesh pattern in the related art is schematically illustrated FIGS. 6A and 6B.

In addition, a line width 80, a line height 90, and a pitch 100 of the metal mesh pattern according to the exemplary embodiment of the present application are schematically illustrated in FIG. 8. The line width, the line height, and the pitch of the metal mesh pattern can be measured by using a method known in the technical field. For example, a method of observing and measuring an SEM cross section, a measurement method using a non-contact surface shape measurer (optical profiler), a measurement method using a stylus surface profilometer (Alpha-Step or Surfacer Profiler), or the like can be used.

According to the exemplary embodiment of the present application, it is possible to reduce wiring recognition by minimizing the widths of the disconnected portions that separate the metal mesh patterns of the first common electrode wiring portion, the second common electrode wiring portion, and the signal electrode wiring portion.

In the exemplary embodiment of the present application, the metal mesh patterns of the first common electrode wiring portion, the second common electrode wiring portion, and the signal electrode wiring portion can be formed by independent printing processes, respectively, or can be formed simultaneously by one printing process. Therefore, the metal mesh patterns of the first common electrode wiring portion, the second common electrode wiring portion, and the signal electrode wiring portion can have the same line width, the same pitch, and the same line height.

In the exemplary embodiment of the present application, since a printing method is used to form the metal mesh patterns of the first common electrode wiring portion, the second common electrode wiring portion, and the signal electrode wiring portion, the metal mesh patterns of the first common electrode wiring portion, the second common electrode wiring portion, and the signal electrode wiring portion, which have thin and precise line widths, can be formed on the transparent substrate. A printing method such as offset printing, screen printing, gravure printing, flexo-printing, inkjet printing, and nano-imprinting can be used as the printing method, but the printing method is not particularly limited, and a combination of the one or more methods can also be used. A roll-to-roll method, a roll-to-plate method, a plate-to-roll method, or a plate-to-plate method can be used as the printing method.

In the exemplary embodiment of the present application, a reverse offset printing method can be applied to implement a precise metal mesh pattern. To this end, in the present application, a method can be performed in which ink, which can serve as a resist at the time of performing etching, is applied entirely onto the silicone-based rubber called a blanket, unnecessary parts are primarily removed by using an intaglio plate with a carved pattern called a cliche, the printed pattern remaining on the blanket is secondarily transferred onto a substrate such as a film or glass on which metal or the like is deposited, and then the transferred pattern is subjected to a firing process and an etching process to form a desired pattern. In this method, since the substrate on which metal is deposited is used, uniformity of the line height is ensured within the entire region, such that there is an advantage in that resistance in a thickness direction can be uniformly maintained. In addition, in the present application, the printing method can comprise a direct printing method of forming a desired pattern by directly printing and then firing conductive ink by using the aforementioned reverse offset printing method. In this case, the line height of the pattern is flattened by pressing pressure, and conductivity can be imparted by a heat firing process, a microwave firing process, a laser partially firing process, or the like that makes connection made by mutual surface fusion of metal nanoparticles.

In the exemplary embodiment of the present application, a glass substrate or a plastic substrate, which is known in the technical field, can be used as the transparent substrate, but the transparent substrate is not particularly limited.

In the exemplary embodiment of the present application, the light emitting element provided on the transparent substrate can be formed by using a material and a method known in the technical field.

Hereinafter, the exemplary embodiments described in the present specification will be exemplified through Examples. However, it is not intended that the scopes of the exemplary embodiments are limited by the following Examples.

EXAMPLES

Experimental Examples 1 to 4

A raw material made by plating a transparent film (Polyester Film V7200 of SKC) with Cu and a dry film resist (DFR, SPG-152 of Asahi Chemical Industry) were laminated. Thereafter, exposure was performed in a state in which a pattern mask was attached thereto, and then development was performed, such that a desired DFR pattern was formed. Thereafter, Cu etching and DFR separation were performed to manufacture a desired Cu wiring pattern (the Cu wiring pattern was provided within a region having an area of 80% or more of the entire area on the transparent film). The Cu wiring pattern was formed to have the structure illustrated in FIG. 3, and a line width, a pitch, a line height, a width of a disconnected portion, and the like of the Cu wiring pattern are shown in the following Table 1. A standard deviation of the line width, the pitch, the line height, the width of the disconnected portion, and the like of the Cu wiring pattern was 2% or less.

Low-temperature solder paste was printed onto an electrode pad portion by screen printing, and then LEDs were mounted on the solder paste. Thereafter, a solder paste reflow process was performed at about 170° C., such that metal in the solder paste bound and bonded the electrode pad portion and an LED pad portion.

TABLE 1

|  | Experimental Example 1 | Experimental Example 2 | Experimental Example 3 | Experimental Example 4 |
| --- | --- | --- | --- | --- |
| Line Width (μm) | 20 | 20 | 20 | 30 |
| Pitch (μm) | 200 | 200 | 200 | 200 |
| Aperture Ratio (%) | 81 | 81 | 81 | 72 |
| Line Height (μm) | 5 | 2 | 5 | 5 |
| Width of Disconnected Portion (μm) | 30 | 30 | 100 | 30 |
| Resistance (Ω/sq) | 0.045 | 0.110 | 0.045 | 0.03 |
| Wiring Recognition | OK | OK | NG | OK |
| Transmittance (%) | 72 | 72 | 72 | 63 |
| LED Lighting | OK | NG | OK | OK |

The wiring recognition was determined based on recognition of disconnection and channel with the naked eye at a spacing distance of 30 cm.

The LED lighting was determined based on lighting of all of the 484 LEDs in a sheet of 0.5 m×0.5 m, the LED lighting was evaluated as OK when all of the 484 LEDs were turned on, and the LED lighting was evaluated as NG when there were LEDs that were not turned on.

An image operated by the transparent light emitting element display according to the exemplary embodiment of the present application is schematically illustrated in FIG. 7.

The transmittance was measured by using COH-400 of Nippon Denshoku Industries Co., Ltd.

Comparative Example 1

Comparative Example 1 was manufactured in the same manner as Experimental Example 1 except that electrode wiring was separately formed in the respective LEDs in Experimental Example 1. A line width, a pitch, a line height, a width of a disconnected portion, and the like of the Cu wiring pattern of Comparative Example 1 are shown in the following Table 2.

TABLE 2

| | Experimental Example 1 | Comparative Example 1 |
|---|---|---|
| Line Width (μm) | 20 | 20 |
| Pitch (μm) | 200 | 200 |
| Aperture Ratio (%) | 81 | 84 |
| Line Height (μm) | 5 | 5 |
| Width of Disconnected Portion (μm) | 30 | 30 |
| Linear Resistance (Ω) | 1 | 12 |
| Electrode Width (mm) | 20 | 1.74 |
| Electrode Length (mm) | 440 | 460 |
| LED Lighting | OK | NG |

The linear resistance was measured based on electrode wiring resistance to the last LED in a column in a power supply unit.

The electrode width (interval between LEDs) of 20 mm is maintained to the last LED in Experimental Example 1, but in a case in which electrode wiring is formed in the respective LEDs in Comparative Example 1, the wiring width of the last LED in the column is reduced to 1.74 mm because the electrode width is divided and distributed to equalize resistance to the respective LEDs.

The electrode length to the last LED is 440 mm in Experimental Example 1 because the 22 LEDs are disposed at an interval of 20 mm in the single column, while the electrode length is 460 mm in Comparative Example 1 because the interval of 20 mm between the LEDs is added to 440 mm.

As seen in the results, according to the exemplary embodiment of the present application, since the metal mesh patterns, which have the same line width, the same line height, and the same pitch, are applied to the first common electrode wiring portion, the second common electrode wiring portion, and the signal electrode wiring portion, it is possible to reduce wiring recognition. In addition, since the metal mesh patterns are provided within the entire region of the effective screen portion on the upper surface of the transparent substrate except for the region in which the light emitting element is provided, it is possible to reduce resistance by maximizing the areas of the common electrode wiring portions.

In addition, according to the exemplary embodiment of the present application, it is possible to reduce wiring recognition by minimizing the widths of the disconnected portions that separate the metal mesh patterns of the first common electrode wiring portion, the second common electrode wiring portion, and the signal electrode wiring portion.

The invention claimed is:

1. A transparent light emitting element display comprising:
   a transparent substrate;
   at least one light emitting element which is provided on the transparent substrate; and
   a first common electrode wiring portion, a second common electrode wiring portion, and a signal electrode wiring portion which are provided on the transparent substrate,
   wherein all of the first common electrode wiring portion, the second common electrode wiring portion, and the signal electrode wiring portion comprise metal mesh patterns, respectively,
   each of the metal mesh patterns, which constitute the first common electrode wiring portion, the second common electrode wiring portion, and the signal electrode wiring portion, has a standard deviation of a line width which is 20% or less, a standard deviation of a pitch which is 10% or less, and a standard deviation of a line height which is 10% or less, and
   the metal mesh patterns are provided in a region having an area of 80% or more of an overall area on the transparent substrate.

2. The transparent light emitting element display of claim 1, wherein at least four electrode pad portions, which electrically connect the light emitting element with the first common electrode wiring portion, the second common electrode wiring portion, and the signal electrode wiring portion, are provided between the transparent substrate and the light emitting element.

3. The transparent light emitting element display of claim 2, wherein the at least four electrode pad portions comprise two signal electrode pad portions, one first common electrode pad portion, and one second common electrode pad portion.

4. The transparent light emitting element display of claim 1, wherein the two or more of the light emitting elements are provided, and the two or more light emitting elements are connected in series to the signal electrode wiring portion.

5. The transparent light emitting element display of claim 1, wherein the signal electrode wiring portion is provided between the first common electrode wiring portion and the second common electrode wiring portion.

6. The transparent light emitting element display of claim 1, wherein the metal mesh pattern satisfies the following Expression 1;

$$(P-W)^2/P^2 = 0.8 \qquad \text{[Expression 1]}$$

wherein P is the pitch of the metal mesh pattern, and W is the line width of the metal mesh pattern.

7. The transparent light emitting element display of claim 1, wherein a surface resistance of the metal mesh pattern is 0.1 Ω/sq or less.

8. The transparent light emitting element display of claim 1, wherein the line width of the metal mesh pattern is 50 μm or less, the pitch of the metal mesh pattern is 100 μm to 1,000 and the line height of the metal mesh pattern is 3 μm or more.

9. The transparent light emitting element display of claim 1, wherein the metal mesh patterns of the first common electrode wiring portion, the second common electrode wiring portion, and the signal electrode wiring portion are separated from one another by disconnected portions, respectively, where no metal mesh pattern is provided, and a width of the disconnected portion is 80 μm or less.

10. The transparent light emitting element display of claim 2, wherein sizes of the electrode pad portions are each independently from 0.1 mm$^2$ to 1 mm$^2$.

11. The transparent light emitting element display of claim 2, wherein intervals between the at least four electrode pad portions are each independently from 0.1 mm to 1 mm.

12. The transparent light emitting element display of claim 1, wherein the metal mesh pattern comprises gold, silver, aluminum, copper, neodymium, molybdenum, nickel, or an alloy thereof.

13. The transparent light emitting element display of claim 1, further comprising:
   at least one capacitor pad portion on the transparent substrate.

* * * * *

UNITED STATES PATENT AND TRADEMARK OFFICE
CERTIFICATE OF CORRECTION

PATENT NO.       : 10,964,869 B2
APPLICATION NO.  : 16/625299
DATED            : March 30, 2021
INVENTOR(S)      : Kun Seok Lee et al.

Page 1 of 1

It is certified that error appears in the above-identified patent and that said Letters Patent is hereby corrected as shown below:

In the Claims

At Column 12, Lines 20-23, please replace Claim 4 with the following:
4. The transparent light emitting element display of claim 1, wherein two or more of the light emitting elements are provided, and the two or more light emitting elements are connected in series to the signal electrode wiring portion.

At Column 12, Lines 28-36, please replace Claim 6 with the following:
6. The transparent light emitting element display of claim 1, wherein the metal mesh pattern satisfies the following Expression 1:
   [Expression 1]
   $(P - W)^2 / P^2 = 0.8$
   wherein P is the pitch of the metal mesh pattern, and W is the line width of the metal mesh pattern.

At Column 12, Lines 40-44, please replace Claim 8 with the following:
8. The transparent light emitting element display of claim 1, wherein the line width of the metal mesh pattern is 50 μm or less, the pitch of the metal mesh pattern is 100 μm to 1,000 μm, and the line height of the metal mesh pattern is 3 μm or more.

Signed and Sealed this
Twenty-fifth Day of May, 2021

Drew Hirshfeld
*Performing the Functions and Duties of the
Under Secretary of Commerce for Intellectual Property and
Director of the United States Patent and Trademark Office*